United States Patent [19]

Scannell et al.

[11] 4,331,916

[45] May 25, 1982

[54] METER MOVEMENT HAVING REINFORCED ARMATURE ASSEMBLY

[75] Inventors: Edward F. Scannell, Saugus; William J. Schultz, Lynnfield, both of Mass.

[73] Assignee: General Electric Co., Syracuse, N.Y.

[21] Appl. No.: 115,823

[22] Filed: Jan. 28, 1980

[51] Int. Cl.³ .......................... G01R 1/16; G01R 1/00
[52] U.S. Cl. .......................... 324/151 R; 324/154 PB
[58] Field of Search ...................... 324/151, 154, 155; 336/208; 242/118.31; 335/222

[56] References Cited

U.S. PATENT DOCUMENTS

| | | | |
|---|---|---|---|
| 448,894 | 3/1891 | Thompson | 324/155 |
| 678,706 | 7/1901 | Weston | 324/155 |
| 3,273,061 | 9/1966 | Rumpelein et al. | 324/151 R |

*Primary Examiner*—Palmer C. Demeo
*Assistant Examiner*—Walter E. Snow
*Attorney, Agent, or Firm*—Robert J. Mooney; Fred Jacob

[57] ABSTRACT

A reinforced bobbin which when wound with a sensing winding forms the armature of a D'Arsonval movement measuring instrument. The reinforced bobbin consists of a thin elongated open rectangular bobbin with detent holes centered along the axis of revolution of the bobbin in the measuring instrument. A nonmagnetic low density ball with a diameter slightly larger than the opening in the bobbin is locked in position inside the bobbin by the detent holes to prevent inward deformation of the bobbin when the measuring instrument is subject to rough handling.

4 Claims, 6 Drawing Figures

METER MOVEMENT HAVING REINFORCED ARMATURE ASSEMBLY

CROSS-REFERENCE TO RELATED APPLICATIONS

The subject application is related to the application of Edward F. Scannell entitled Adjustable Spring Regulator For Setting Indicating Instrument Pointer, filed Oct. 2, 1978, Ser. No. 948,174, now U.S. Pat. No. 4,223,266 and assigned to the same assignee as the subject application. This application also relates to the application of Edward F. Scannell and Donald E. Rogers, filed Oct. 2, 1978, Ser. No. 948,171 now U.S. Pat. No. 4,206,406, assigned to the same assignee as this application and entitled Means For Adjusting The Zero Point Setting Of An Instrument.

This application further relates to the application of Carl F. Van Bennekom, Donald E. Rogers and Edward F. Scannell, filed Oct. 2, 1978, Ser. No. 948,173 now U.S. Pat. No. 4,237,418, entitled Electrical Current Indicating Meter and assigned to the same assignee as this application.

Further this application relates to the application of William J. Schultz and Carl F. Van Bennekom, filed Oct. 2, 1978, Ser. No. 943,172, now U.S. Pat. No. 4,251,771 entitled Magnetic System for Electrical Current Indicating Meter, and assigned to the same assignee as this application.

Still further this application relates to the application of Edward F. Scannell and Edward D. Orth, filed Oct. 2, 1978, Ser. No. 948,197 now U.S. Pat. No. 4,253,062, entitled Shielded Electrical Current Indicating Meter, and assigned to the same assignee as this application.

This application still further relates to the application of Carl F. Van Bennekom and William J. Schultz, filed Oct. 2, 1978, Ser. No. 948,191 now U.S. Pat. No. 4,229,874, entitled Pivot Insert Method and Article, and assigned to the same assignee as the subject application.

BACKGROUND OF THE INVENTION

This invention relates to an improved armature assembly in a D'Arsonval type instrument.

It is well known that electrical instruments have very broad use in the electrical measuring art. Because of the large number of measurements which are made in regulating processes and apparatus operated electrically there is need for large numbers of instruments. Because of the large number there is a premium on the smaller size instruments so that the instruments can be grouped to give readily available information to persons using the instruments.

Further, because of the very large number of such instruments which are used and the many purposes and applications in which they are employed, it is desirable that they be made at low cost and yet with high reliability and accuracy in performance.

Instruments of the D'Arsonval type include a moving armature or coil assembly which is mounted for rotation through the field of a permanent magnet assembly. When the armature assembly is energized by means of a current flowing therethrough, the resulting magnetic fields interact to produce a torque which rotates the armature assembly relative to the permanent magnet assembly. An instrument pointer is generally connected to the movable armature assembly to yield a readout with respect to a faceplate or scale mounted behind the pointer as the torque is a function of the current magnitude.

One of the requirements for accuracy in electrical instruments of the D'Arsonval type as provided pursuant to the present invention is that they have small profile and yet be capable of producing reproducible readings from one meter to another. In part this is dependent on having a suspension mechanism for the armature assembly which is of desirably low profile, is sturdy and yet which can be produced with great reliability at low cost and in the desirable small size.

Of particular importance is the structuring of the armature assembly so that it will pivot with reliable low resistance to turning. In this respect the pivot mechanism, that is the means on which the armature assembly turns, must have both a low resistance to turning and also a high reproducibility in such low resistance from one meter to another. Further, it is highly desirable that this reproducibility be maintained over an extended period of time.

Although the mechanism as described and claimed in the applications referenced above has proven to be highly satisfactory and has been manufactured and sold with a great degree of success in providing reliable economical meter units to the purchasing public, there are, of course, improvements which can be made in the structure and one of these improvements relates to the use of the structure in a more rigorous or demanding environment. One such environment is an environment in which the structure is vibrated, dropped or subjected to rapid changes in motion. In such cases it has been found that although the structure is reliable and has a long useful life as described above in normal circumstances, over a period of time, jarring, vibration, dropping or rapid motion can change the reading from the device as it can cause some distortion of the bobbin about which the sensing coil is wound to form an armature. The bobbin is itself preferably an article of relatively lightweight construction and may be made of aluminum in a preferred embodiment. The bobbin has an elongated shape to achieve the desired low profile. The aluminum bobbin also serves as a single winding damping coil to obtain prompt response from the instrument in measuring. If a less flexible aluminum is used, there is a loss of conductivity and a corresponding loss of damping. In spite of the light weight of the aluminum bobbin and sensing coil, when the overall structure is subjected to the rapidly changing motion as described above, there is some tendency for the bobbin to fold inward so that the points of the pivot needles do not seat as precisely in their jeweled pivot sockets as is desirable. Accordingly, there can be a loss of accuracy if the article is subjected to very rapid motion changes such as occur in strong vibration, dropping or other impacting.

It is, therefore, an object of the present invention to provide an accurate, shock-resistant D'Arsonval movement.

It is a further object of the present invention to provide an accurate, shock-resistant D'Arsonval movement having a low profile.

SUMMARY OF THE INVENTION

One form of the present invention is a reinforced bobbin which when wound with a sensing winding forms the armature of a D'Arsonval movement measuring instrument. The reinforced bobbin consists of an elongated, open, rectangular bobbin with detent holes centered along the axis of revolution of the bobbin in the measuring instrument. A nonmagnetic, low density ball with a diameter slightly larger than the opening in the bobbin is locked in position inside the bobbin by the detent holes.

The resulting reinforced bobbin does not deform under impact of the measuring instrument and keeps the pivot mounted on the armature properly located in the jewel bearings.

DESCRIPTION OF THE DRAWING

While the specification concludes with claims particularly pointing out and distinctly claiming the present invention, the objects and advantages of the invention can be more readily ascertained from the following description of a preferred embodiment when read in conjunction with the accompanying drawing in which:

DESCRIPTION OF THE PREFERRED EMBODIMENT

Figure 1:
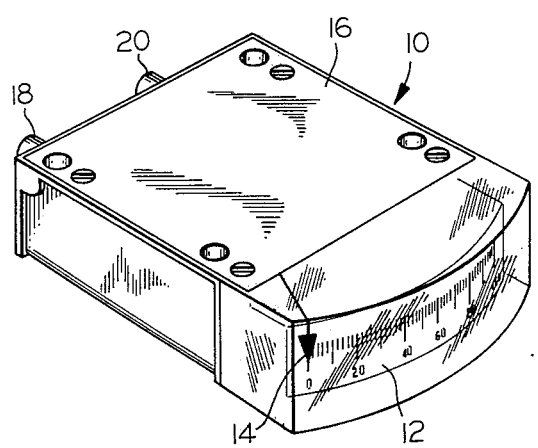
FIG. 1 is an exterior perspective view of an electric measuring instrument as may be provided pursuant to the present invention.

Referring first to FIG. 1, the instrument illustrated is one of a number of possible instruments in which the mechanism of the present invention can be employed. The particular instrument illustrated is an electrical instrument having a front scale 12, a pointer 14, which shows the values indicated by the instrument on the scale, and a generally rectangular housing 16 containing the sundry electrical elements and parts which make up the instrument. In the case of an electrical instrument the two electrical terminals 18 and 20 are the terminals to which wires carrying the current to be measured are connected.

Figure 2:
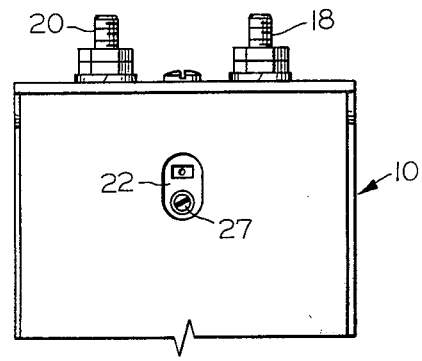
FIG. 2 is a partial bottom view of the instrument of FIG. 1.

In FIG. 2, an opening 22 in the back of casing 16 of instrument 10 makes visible a central hole shown to include the jeweled pivot socket containing screw member 27.

Figure 3:
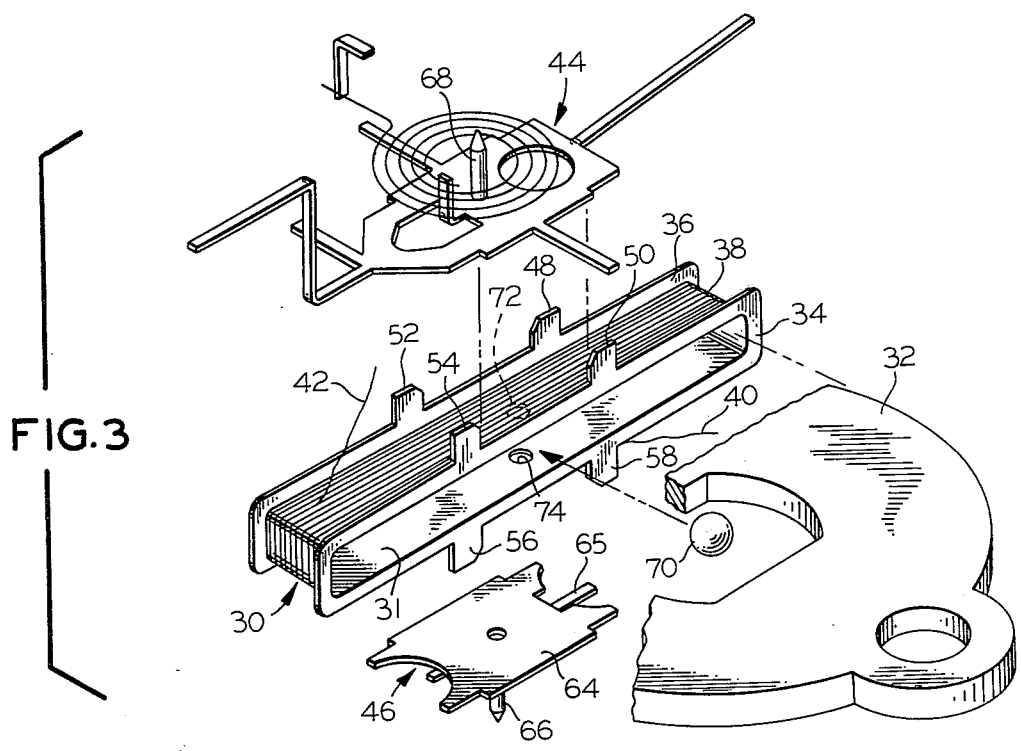
FIG. 3 is a detailed exploded view of a bobbin, ball, and related mechanism as may be provided pursuant to the present invention.

Turning to FIG. 3, the details of the bobbin 30 are illustrated. The bobbin 30 is a thin hollow elongated rectangular spool which can be made of aluminum. The length of the bobbin is much greater than the width to help provide an instrument having a low profile. There are two detent holes 72 and 74, one centered on the upper face of the bobbin, the other centered on the lower face. The two detent holes have their center point on the axis of rotation of the bobbin in the instrument.

The opening 31 in the hollow bobbin 30 is in the general form and dimension of the cross-section of the upper flux plate 32. Flanges 34 and 36 extend from the outer edges of the bobbin to contain the winding of insulated electric wire. The winding has two ends 40 and 42 which are attached to the upper strip 44 and lower strip 46 respectively.

The upper strip 44 is held in place on the top of the bobbin 30 by the upwardly extending tabs 48, 50, 52 and 54. These tabs are folded inward over respective parts of the strip 44 to hold the strip in place on the bobbin. The lower strip 46 serves an an insulating strip and it is held to the bobbin by folding four tabs 56, 58, 60 and 62, only two of which are evident in FIG. 3, against the appropriate surfaces of the lower strip 46.

The lower strip 46 is made up of an insulating strip 64, a conducting strip 65 and the pin 66. The pin 66 is driven into and through strip 65 to mount the pin in the strip. The insulating strip 64 is joined with strip 65 which has pin 66 mounted in it. The upper strip 44 has a pin 68 driven into it to mount the pin in the strip. The pin 68 and strip 44 are then mounted on the bobbin as previously described.

The bobbin 30 is assembled over the flux plate 32. A low density nonmagnetic ball 70, preferably of nylon, but rubber or similar material would be satisfactory, having a diameter slightly larger than the opening in the bobbin is inserted in the opening of the bobbin. The ball is captured by the detent holes which lock the ball in a central position in the bobbin, maintaining the balance and stiffening the bobbin. The opening 31 widens slightly when the ball is introduced, but the opening returns to its original height when the ball is locked in position in the detent holes 72 and 74.

Figure 4:
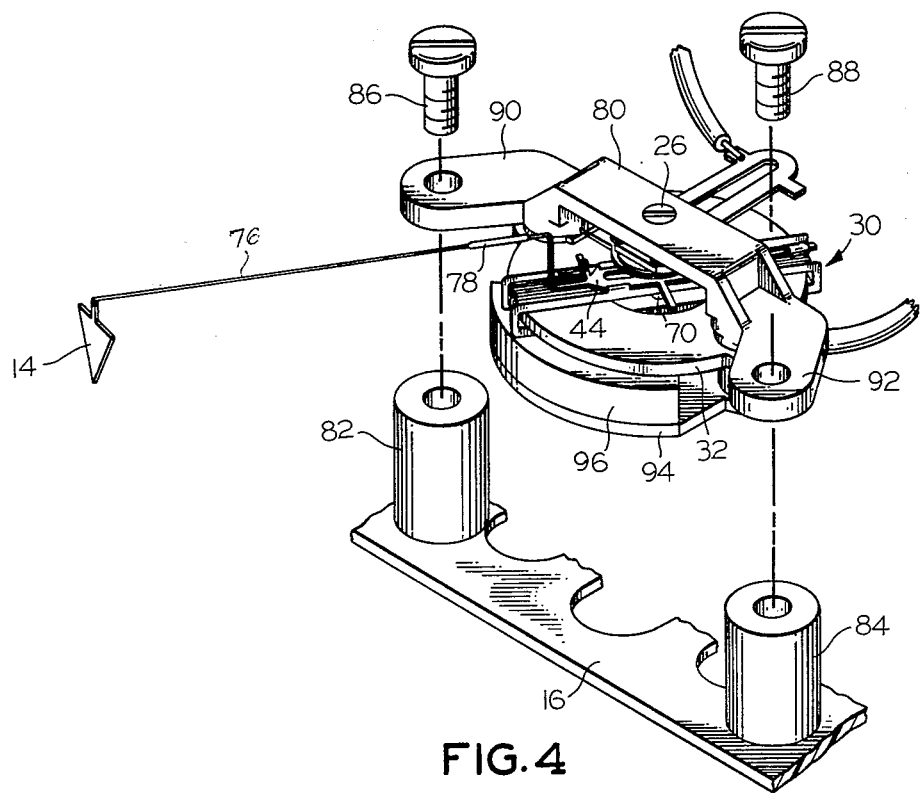
FIG. 4 is a partially exploded perspective view of the internal mechanism of the instrument as may be provided pursuant to the present invention.

Referring next to FIG. 4, one form of mounting of portions of an electrical measuring instrument is shown in a partially exploded perspective view. The pointer 14 corresponds to the pointer 14 in FIG. 1. The pointer arm 76 extends back from the pointer 14 to the pointer arm support 78. This support 78 is formed integrally with a plate 44 and the plate is mounted on the bobbin 30. The bobbin pivots about an upper flux plate 32. A magnetic element 96 is disposed above lower flux plate 94. The assembly is supported by the yoke 80 and is assembled to the posts 82 and 84 in the housing element 16. The screw members 86 and 88 hold the arms 90 and 92 of the yoke 80 in the respective positions in the posts 82 and 84.

The bobbin 30 is assembled over the flux plate 32. The ball is inserted in the bobbin and the flux plate 32 is assembled to the flux plate 94 using the yoke 50 to hold the parts together. Yoke 80 has two depending legs. These legs pass through openings in upper flux plate 32, through the two spacer bushings and through openings in the lower flux plate 94. Magnet elements 96 and 98 (element 98 not shown in this Figure) are also assembled into their respective positions on lower flux plate 94 and when so assembled provide the flux and corresponding magnetic field through which the bobbin, and the winding wound on the bobbin, turn as the instrument is utilized.

Figure 5:
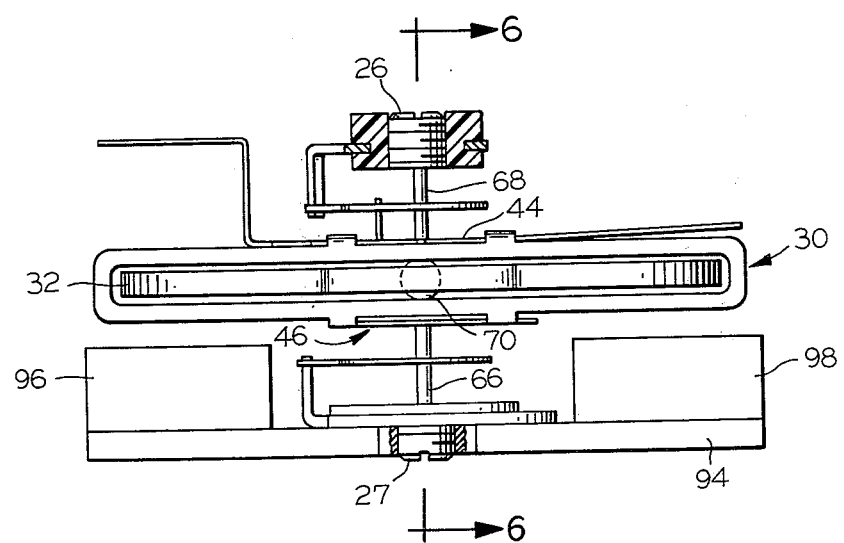
FIG. 5 is a vertical sectional view of the bobbin and ball as assembled together with other elements of the instrument mechanism.

Turning now to FIG. 5, the location of the ball 70 relative to the axis of rotation of the bobbin 30 can clearly be seen.

Figure 6:
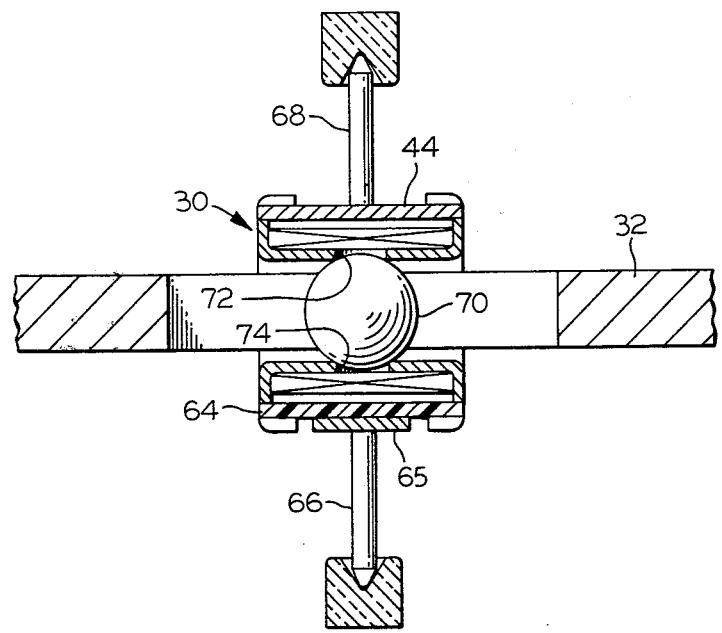
FIG. 6 is a sectional view taken along section line 6—6 of FIG. 5 showing details of how the ball is positioned in the bobbin.

FIG. 6 shows the pins with conical ends seated in jeweled bearings 26 and 27. It can be seen that with the ball in place, the pivot to pivot distance will not decrease under impact causing loss of accuracy, binding of the moving system and other problems. Without the ball, the bobbin could deform under impact and the pivot to pivot distance would decrease causing the conical ends of pivots not to seat properly in their respective jeweled bearings, causing a loss of accuracy. It is also possible that in cases of severe eccentricity binding between parts of the meter could result. By reducing the possibility of eccentricity, tighter clearances can be maintained between moving parts and non-moving parts resulting in an accurate rugged low profile measuring instrument.

Although this invention has been described with reference to a specific embodiment thereof, the foregoing will suggest numerous modifications which are possible without departing from the invention. Accordingly, it is desired to cover all modifications within the spirit and scope of this invention.

What we claim as new and desire to secure by Letters Patent of the United States is:

1. An armature assembly in a D'Arsonval movement measuring instrument comprising:
   an open rectangular bobbin having a substantially longer length than width, said bobbin having detent holes centered in the inner surfaces of the longer length and along the axis of revolution of said bobbin; and
   a ball having a slightly larger diameter than the opening of said bobbin, with said ball seated in said detent holes whereby the deformation of said bobbin is lessened under impacting received by said measuring instrument.

2. The armature assembly in claim 1 wherein said bobbin is aluminum.

3. The armature assembly in claims 1 or 2 wherein said ball is of low density nonmagnetic material.

4. An armature assembly for an electrical device comprising:
   an open rectangular bobbin having an electrical winding thereon;
   said bobbin having sides with a longer length than width and having detent holes centered in the longer length sides and positioned along the axis of rotation of said bobbin; and
   a ball seated in said detent holes.

* * * * *